Oct. 31, 1967 D. H. RAUSCHER 3,349,474

SEMICONDUCTOR DEVICE

Original Filed Dec. 26, 1963 3 Sheets-Sheet 1

INVENTOR.
DANIEL H. RAUSCHER
BY
W. S. Hill
Agent

Oct. 31, 1967 D. H. RAUSCHER 3,349,474

SEMICONDUCTOR DEVICE

Original Filed Dec. 26, 1963 3 Sheets-Sheet 2

INVENTOR.
DANIEL H. RAUSCHER
BY
W. S. Hill
Agent

Oct. 31, 1967 D. H. RAUSCHER 3,349,474

SEMICONDUCTOR DEVICE

Original Filed Dec. 26, 1963 3 Sheets-Sheet 3

INVENTOR.
DANIEL H. RAUSCHER

BY

W. S. Hill

Agent

United States Patent Office 3,349,474

Patented Oct. 31, 1967

3,349,474
SEMICONDUCTOR DEVICE

Daniel H. Rauscher, Williamstown, Mass., assignor to Radio Corporation of America, a corporation of Delaware Continuation of application Ser. No. 333,351, Dec. 26, 1963. This application Aug. 5, 1966, Ser. No. 573,773
7 Claims. (Cl. 29—574)

ABSTRACT OF THE DISCLOSURE

A conductive channel is formed beneath a silicon oxide coating in a crystalline silicon body by first forming the oxide in such a way that the conductivity of the body is less than a desired value, and then heating the body in a hydrogen-containing ambient to increase the conductivity of the silicon body beneath the oxide coating to the desired level.

This application is a continuation of my copending application, Ser. No. 333,351, filed Dec. 26, 1963, for "Semiconductive Devices," now abandoned.

This invention relates to improved methods of fabricating semiconductive devices, and more particularly to improved methods of introducing or forming a conductive channel in semiconductive devices.

In the fabrication of certain semiconductor devices, a conductive channel or region is formed in a crystalline semiconductive wafer. Conductive regions have been formed in semiconductive wafers by alloying a quantity of a conductivity type-determining substance or modifier (a substance which is either an acceptor or a donor in the particular semiconductor employed) to the surface of the wafer. Conductive channels have also been formed in semiconductive wafers by diffusing conductivity modifiers through all or part of the wafer surface. Another method of forming a conductivity channel is to deposit heavily doped semiconductive material as a thin epitaxial layer on a high resistivity wafer of the same semiconductive material. For the fabrication of some kinds of semiconductors, such as field effect devices, it is desirable that the conductive channels in a large number of units be closely similar as to size, shape and resistivity, in order to insure uniformity in the electrical parameters of the completed devices. It is also desirable that the conductive channel in certain semiconductive devices, such as field effect transistors, be very thin.

It is known that when some crystalline semiconductors are heated to high temperatures, a thin surface layer of the wafer is often converted to opposite conductivity type. For example, when a silicon wafer is heated in steam or in ordinary oxidizing ambients to form a silicon oxide surface layer on the surface, a thin surface region of the wafer immediately beneath the silicon oxide layer becomes N-type if the wafer consists of a pulled crystal, and becomes P-type if the wafer consists of a floating zone crystal. However, the N-type surface region thus produced is not presently preferred for use as a conductive channel in the kind of field effect device known as an insulated gate field-effect device, because the surface states of crystal silicon wafers are very sensitive to surface preparation, oxidation processes, and the past history of the silicon crystal, so that the results obtained depend on the specific treatment utilized during fabrication. It is believed that N-type inversion layers formed by oxidizing silicon in steam or in other conventional ambients have a great many associated surface states which act as traps, and tend to immobilize charge carriers, thus decreasing the transconductance of the device to unacceptable levels.

It is an object of this invention to provide methods of fabricating improved semiconductor devices.

It is another object of the invention to reduce the time and cost of fabricating thin conductive channels in semiconductive wafers.

It is another object of the invention to improve the uniformity from devices to device of the thin conductive channels formed in the process of fabricating semiconductive devices.

Another object of this invention is to provide improved methods of introducing conductive channels in semiconductive wafers.

Still another object is to provide improved methods of forming, in crystalline semiconductive wafers, conductive channels that are uniform from wafer to wafer as to resistivity. But another object is to provide rapid and inexpensive methods of forming very thin conductive channels in semiconductive wafers.

These and other objects of the invention are accomplished by the method of forming a conductive channel in a crystalline semiconductive silicon body comprising the steps of, first forming a silicon oxide coating over said body while avoiding the formation of an inversion layer on the surface of said body, and then heating the body in a reducing ambient to form a thin conductive channel in said body underneath said silicon oxide coating.

The invention and its features will be described in greater detail with reference to the accompanying drawings, in which.

Figures 1, 2, 3, 4, 5:
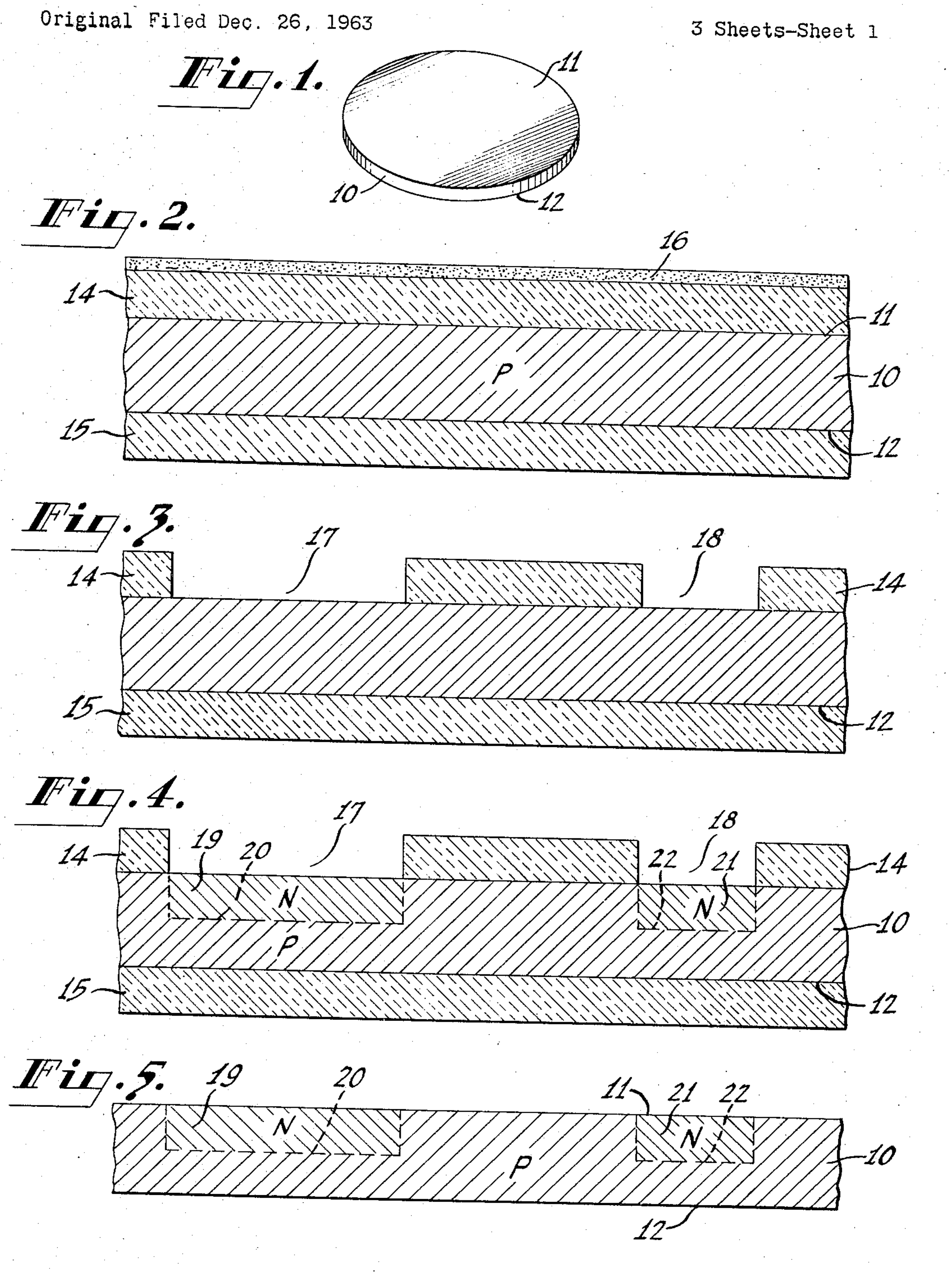
FIGURE 1 is a perspective view of a semiconductive wafer.
FIGURES 2–9 are cross-sectional views of a portion of the semiconductive wafer of FIGURE 1 during successive steps in the fabrication of a semiconductor device in accordance with one embodiment of this invention.
Figure 6:
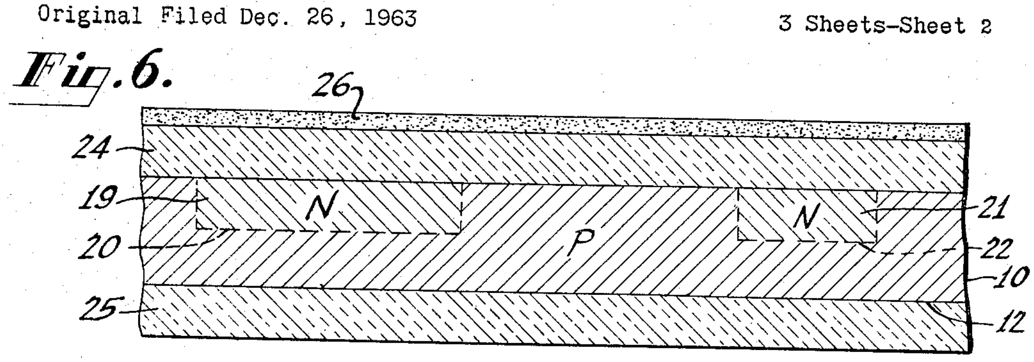
Figure 7:
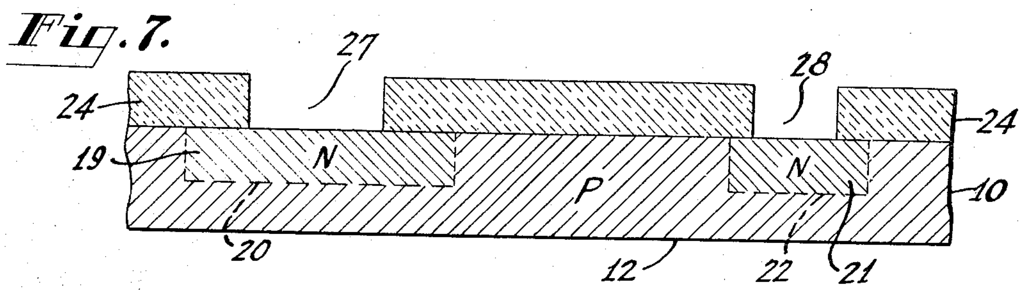
Figure 8:
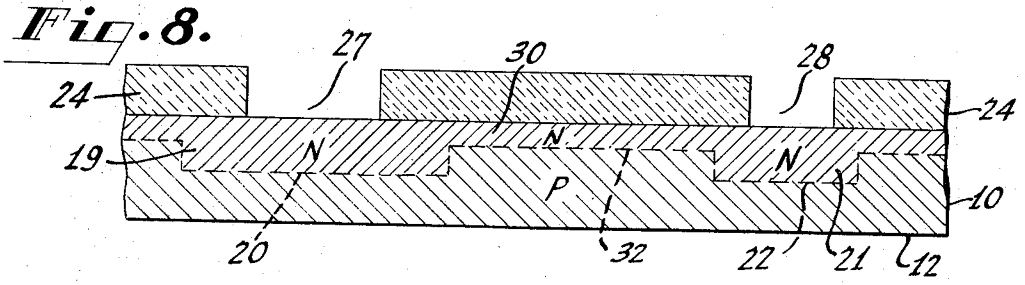
Figure 9:
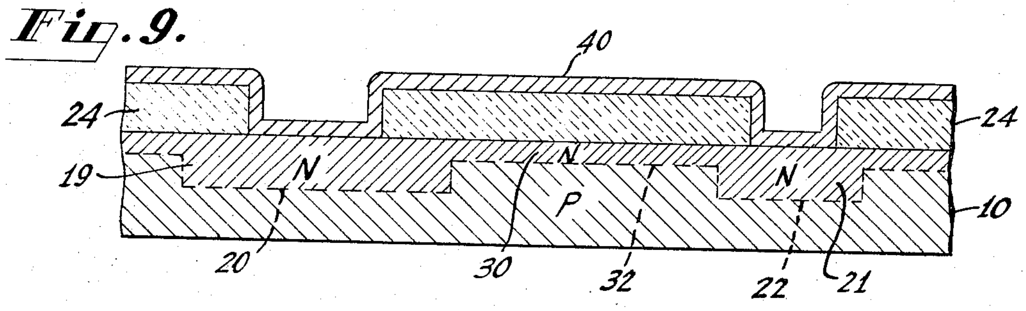
Figure 10:
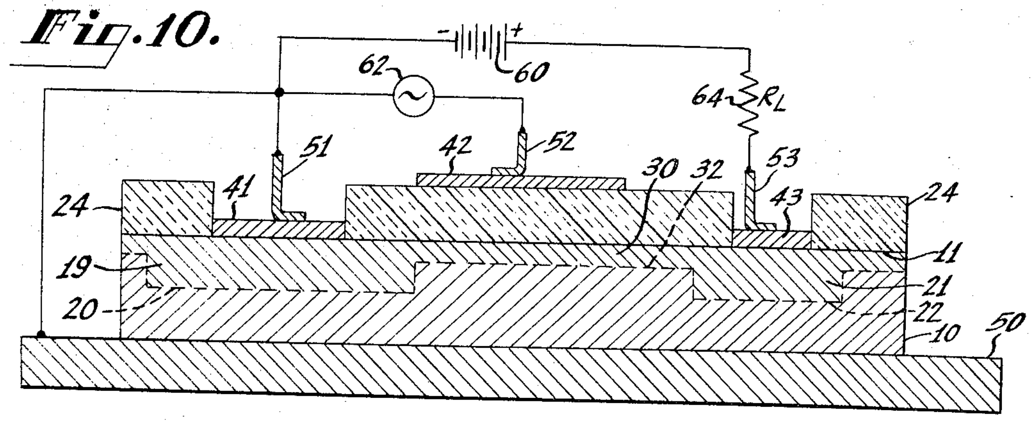
FIGURE 10 is a cross-sectional view of a completed device fabricated according to this embodiment, together with a schematic circuit.

The type of semiconductor device in which the conductivity of a portion of a semiconductive wafer may be modulated by an applied electric field is known as a field effect device. One kind of field effect device consists of those units which have an insulating layer over a portion of the surface of a crystalline semiconductive wafer, and have a control electrode disposed on this insulating layer. Units of this kind are known as insulated gate field-effect devices, and generally comprise a layer or wafer of crystalline semiconductive material, two spaced conductive regions adjacent one face of said layer, a film of insulating material on said one face between said two spaced regions, two metallic electrodes bonded respectively to said two spaced conductive regions, and a metallic control electrode on said insulating film between said two spaced regions.

One class of insulated gate device is known as the MOS (Metal-Oxide Semiconductor) transistor, and is described by S. R. Hofstein and F. P. Heiman in "The Silicon Insulated-Gate Field-Effect Transistor," PROC. IEE, vol. 51, page 1190, September 1963. In devices of this type, the metallic control electrode on the insulating film (the film usually consists of silicon oxide) is also known as the gate electrode, while the two electrodes bonded directly to the semiconductive wafer are known as the source and drain electrodes.

MOS transistors may be of two general types, one type being known as the enhancement type, and the other as the depletion type. In depletion type MOS transistors, there is a thin conductive channel adjacent the wafer surface between the source and drain regions and, in devices of this type, there is a drain current when the gate bias is zero. When a negative gate bias is applied to depletion type MOS transistors, the conductivity of the N-type conductive channel is decreased or "pinched off," and the source-drain current is decreased. When a positive gate bias is applied to these devices, the conductivity of the channel increases, and the source-drain current increases. Thus both positive and negative gate biases are effective in modulating the drain current of depletion type MOS transistors.

Although the invention will be described in terms of a depletion type MOS transistor as a specific example, it will be understood that the invention may be applicable to other semiconductor devices, in which a thin conductive channel is provided in a crystalline semiconductive wafer beneath an insulating layer.

*Example I*

A crystalline semiconductive silicon wafer 10 (FIGURE 1) is prepared with two opposing major faces 11 and 12. The exact size, shape, conductivity type and resistivity of wafer 10 is not critical. Wafer 10 may be of P-type conductivity, or intrinsic, or of light N-type conductivity. In this example, wafer 10 is a disc-shaped transverse slice of a monocrystalline P-type ingot, and has a resistivity of about 1 to 100 ohm-cm. Suitably, wafer 10 is about ¾" in diameter and 6 mils thick.

A silicon oxide coating is deposited over the face of wafer 10 by any convenient method. Since this coating is subsequently removed, its thickness is not critical. When wafer 10 consists of silicon, as in this example, the silicon oxide layer may be formed by heating the wafer in steam for about 30 minutes at about 1050° C. Silicon oxide coatings 14 and 15 about 2000–4000 Angstroms thick (FIGURE 2) are thus grown on faces 11 and 12 respectively of wafer 10. A thin layer 16 of a photoresist is deposited on one oxide coating 14. The photoresist may, for example, be a bichromated protein such as bichromated gum arabic, bichromated gelatin or bichromated albumin. Alternatively, a commercially available photoresist such as light-sensitive film-forming polyesters derived from 2-propenylidene malonic compounds and bi-functional glycols containing two to twelve carbon atoms may be utilized.

The photoresist layer 16 is exposed to a suitable light pattern, and developed; those portions of the photoresist not exposed to light are removed by means of a solvent, thereby exposing portions of silicon oxide layer 14, the hardened polymerized portions of the photoresist which remain on silicon oxide layer 14 serve as a mask during the subsequent etching step. The exposed portions of the silicon oxide layer 14 are removed by means of an etchant such as a hydrofluoric acid solution. The polymerized portions of the photoresist are then removed by a suitable stripper such as methylene chloride, leaving wafer 10 as in FIGURE 3, with a pair of openings 17 and 18 in silicon oxide layer 14 in each portion of the wafer. The exact size and shape of openings 17 and 18 are not critical; they may be regular shapes such as polygons or circles, or may be irregular in shape. When the source and drain regions of an MOS transistor have the same size and shape, the device is symmetrical, that is, the source and drain regions may be interchanged without affecting the electrical characteristics of the device. In this example, the openings 17 and 18 are rectangular, but the area of one opening 18 is made very small, for example, 30 square mils, which is smaller than the area of the other opening 17, because it has been found that improved results at elevated frequencies are obtained by making the drain area of an MOS transistor very small. The source area 17 does not appreciably affect the high frequency performance, and hence may be made relatively large for greater ease in bonding lead wires. It will be understood that only a single portion of the slice 10 is shown in FIGURES 2–9, and that the pattern of pairs of adjacent openings 17 and 18 within oxide layer 14 may be repeated many times in a regular array on face 11 of wafer 10.

Wafer 10 is now heated in an ambient containing phosphorus pentoxide vapors for about 10 to 20 minutes at about 1000° C. Phosphorus diffuses into the exposed regions 19 and 21 (FIGURE 4) of water 10 immediately beneath openings 17 and 18 respectively. Since phosphorus is a donor in silicon, and the wafer 10 is originally of P-type conductivity, rectifying barriers or p-n junctions 20 and 22 are formed at the boundaries between the N-type phosphorus-diffused regions 19 and 21 and the P-type bulk of wafer 10. Under these conditions, the phosphorus-diffused regions 19 and 21 may be about 5000 to 20,000 Angstroms thick. In this example, the exposed surface area of region 21 is less than the surface area of region 19, as the area of opening 18 was less than the area of opening 17.

Wafer 10 is now treated in an etchant containing hydrofluoric acid so as to completely remove oxide layer 15 and the remaining portions of oxide layer 14, leaving the wafer as in FIGURE 5.

Wafer 10 is reheated in an ambient of pure dry oxygen for a time and a temperature sufficient to form a silicon oxide coating or layer thereon. The exact time and temperature of this heating step is not critical. At higher temperatures, a shorter heating time may be utilized. At lower temperatures, a longer heating time is required to produce the same coating thickness. In this example, wafer 10 is heated, for about three to four hours, at about 1000° C. Clean new silicon oxide coatings 24 and 25 (FIGURE 6) about 1000 to 3000 Angstroms thick are thus formed on wafer faces 11 and 12, respectively. It has now been found that when oxide coatings are formed in this manner, the tendency for semiconductive silicon wafers to develop surface inversion layers is minimized.

A thin layer 26 of photoresist is deposited on silicon oxide coating 24. The photoresist layer 26 is exposed to a suitable light pattern; unexposed portions of the photoresist are removed by any suitable solvent, thereby exposing portions of silicon oxide layer 24. The exposed portions of silicon oxide layer 24, as well as all of silicon oxide layer 25, are then removed by means of a hydrofluoric acid solution. The remaining portions of the photoresist are removed with a suitable stripper, leaving the wafer 10 as in FIGURE 7, with contact openings 27 and 28 extending through the oxide coating 24. The exact size and shape of contact openings 27 and 28 is not critical, but openings 27 and 28 are entirely within the surface boundary of the phosphorus-diffused regions 19 and 21, respectively.

Wafer 10 is now heated in a reducing ambient such as hydrogen, or mixtures of hydrogen and a non-oxidizing gas such as argon or nitrogen. Mixtures of nitrogen and a few volume percent hydrogen, known as forming gas, are useful for this purpose. A suitable forming gas consists of 90 volumes of nitrogen and 10 volumes of hydrogen. Heating may suitably be at temperatures of about 200° C. to 1000° C. At about 1000° C., heating for less than a minute is sufficient. As the heating temperature is decreased, the time of heating is increased. During this step, a thin surface region 30 (FIGURE 8) of wafer 10 beneath the silicon oxide coating 24 is converted to N-type conductivity. The thin surface region 30 is known as an inversion layer, and can be utilized as a conductive channel. A p-n junction 32 is formed at the boundary between the inversion layer 30 and the bulk of wafer 10. The inversion layer 30 thus formed is too thin for accurate direct measurement. The thicknesses of the various wafer regions in the drawing are not to scale, and have been exaggerated for greater clarity. Layer 30 is estimated to be of the order of 100 Angstroms thick. Although the thickness of the conductive channel or inversion layer 30 is thus less than the length of a single wave of visible light, the presence of the conductive channel after this treatment may be demonstrated by placing two probes respectively against the wafer surface, on the regions 19 and 21, and measuring with an ammeter the current which flows between the two probes for a given applied voltage. When such measurement is made on a wafer that does not have a conductive channel or surface region, the assemblage acts like a pair of diodes back-to-back, and very little current flows for a similar applied voltage. When such measurement is made on a wafer that does have a conductive channel or surface region 30 between the regions 19 and 21, a substantial current flows.

An important advantage of the conductive channel 30 thus formed is that it is relatively free from traps, thus enabling the fabrication of devices which exhibit good transconductance.

An advantage of this method is that the resistivity of the conductive channel 30 thus formed may be measured before completion of the device, by contacting two probes against the exposed portions of the phosphorus-diffused regions 19 and 21. If the measured resistivity is too high, the device may be reheated in the hydrogen-containing ambient to increase the conductivity of the inversion layer 30. Suitably, the resistance of the device channel thus measured is at a value between about 100 ohms to 10,000 ohms.

If desired, the method may be modified to employ continuous monitoring of the conductivity of the conductive channel 30 during the step of heating the silicon body in a hydrogen-containing ambient such as forming gas. Two spaced probes are directed against the regions 19 and 21 when the wafer is positioned in the furnace, and the amount of current flowing between the two probes for a given voltage is measured. The apparatus may be arranged so that when a given value of current flows between the two probes, the furnace is automatically turned off.

The silicon body 10 is cooled to room temperature, and a film 40 (FIGURE 9) of a conductive metal is deposited by any convenient method over the remaining portion of oxide layer 24 and over the exposed portions of wafer face 11. In this example, film 40 consists of aluminum, is about 3000 to 6000 Angstroms thick, and is deposited by evaporation. Desired portions of the aluminum film 40 on wafer regions 19 and 21 and on a portion of the oxide layer are now masked, utilizing either the photoresist techniques described above, or an acid resist (not shown) such as paraffin wax, apiezon wax, and the like. The unmasked portions of metal film 40 are removed by means of a suitable etchant, and the resist is dissolved by a suitable organic solvent, leaving one portion of metallic film 40 as an electrode 41 in contact with wafer region 19; another portion as electrode 43 in contact with wafer region 21; and a third portion as an electrode 42 on the silicon oxide coating 24 over the conducting channel 30.

The device is completed by bonding electrical lead wires 51, 52 and 53 to electrodes 41, 42 and 43, respectively, by any convenient method such as soldering, or thermocompression bonding. The silicon body 10 may now be cut from the wafer and is mounted with major face 12 down on a metallic header 50. The subsequent steps of encapsulating and casing the device are accomplished by standard techniques of the semiconductor art, and need not be described here.

The device of this example may be operated as follows. Leads 51 and 53 are the source and drain leads respectively, while lead 52 is the control or gate lead. A source of direct current potential such as a battery 60 is connected between source lead 51 and drain lead 53, so that the source electrode 41 and the source region 19 of the device are poled negative relative to the drain electrode 43 and the drain region 21. The header 50 is electrically connected to the source lead 51. A source 62 of signal potential is connected between the gate lead 52 and the source lead 51. If desired, in addition, a source of constant voltage bias, not shown, may be supplied between gate lead 52 and source lead 51. The load, shown as a resistance 64, is connected between the positive terminal of battery 60 and the drain lead 53. The output signal is developed across the load resistor 64.

Figure 15:
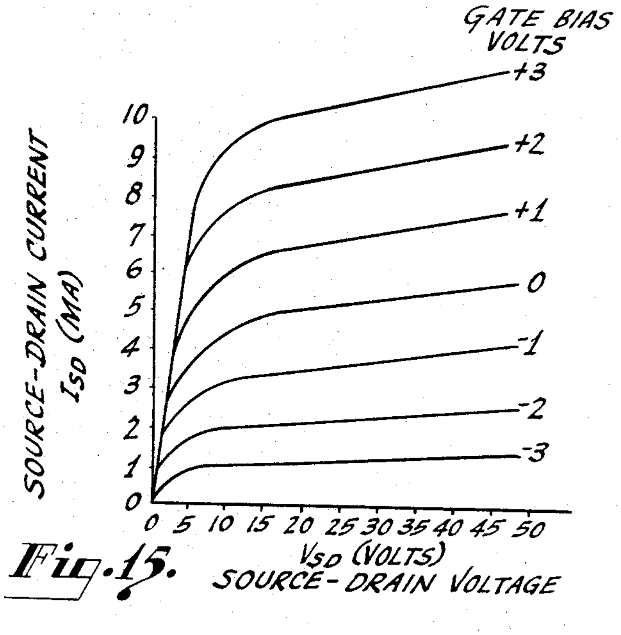

The characteristic curves of one depletion type MOS transistor made according to this example, obtained by plotting source drain current, measured in milliamperes, against source drain voltage, measured in volts, for different values of positive and negative gate-to-source bias in volts, are shown in FIGURE 15. Depending on the times and temperatures of the process, the zero bias source may be raised or lowered. By increasing the period of treatment in a hydrogen-containing ambient, the conductivity of the channel in the device is increased, and hence the amount of current which flows at zero bias is increased.

*Example II*

Whereas in Example I the silicon wafer was P-type, in this example the semiconductive wafer or slice 10 (FIGURES 1–10) consists of intrinsic silicon having a resistivity of about 100 ohm-cm., and the conductivity modifier diffused into the wafer is antimony. The steps of diffusing a donor such as antimony into selected portions of one wafer face 11 to form a pair of N-type source and drain regions 19 and 21 in the wafer, thermally growing a silicon oxide coating 24 on the wafer surface without forming an inversion layer thereon by utilizing pure dry oxygen as the ambient while heating the wafer, forming openings 27 and 28 in the silicon oxide coating 24 on said one wafer face 11 entirely within the surface boundary of said donor-diffused regions 19 and 21, heating the wafer in a reducing ambient such as a mixture of hydrogen and a non-oxidizing gas such as argon or nitrogen, at a temperature of about 200° C. to 1000° C. to form a thin N-type inversion layer 30 beneath the silicon oxide coating on said one wafer face and depositing metallic electrodes on the two donor-diffused regions 19 and 21 of the wafer and on the silicon oxide layer 24 between them, are similar to those described in Example I above.

*Example III*

While the silicon wafer utilized was P-type in Example I, and was intrinsic in Example II in this example the semiconductive wafer of slice 10 (FIGURES 1–10) consists of lightly N-type monocrystalline silicon having a resistivity of about 20 ohm-cm., and the conductivity modifier diffused into the wafer is arsenic. The steps of diffusing a donor such as arsenic into selected portions of one wafer face 11 to form a pair of N-type source and drain regions 19 and 21 in the wafer, thermally growing a silicon oxide coating 24 on the one wafer face 11 and at the same time avoiding the formation of a layer thereon by utilizing pure dry oxygen as the heating ambient, forming openings 27 and 28 in the silicon oxide coating 24 on said one wafer face 11 to expose contact areas entirely within the surface boundary of the source and drain regions 19 and 21, heating the wafer in a reducing ambient at a temperature of about 200° to 1000° C. to form a thin N-type region 30 beneath the silicon oxide coating 24 on wafer face 11, and depositing metallic electrodes on the two donor-diffused regions 19 and 21 of the wafer and on the silicon oxide layer 24 between them, are similar to those described above in Example I.

The process of any of the foregoing examples may be used to fabricate devices with a wide variety of configurations.

Figure 11:
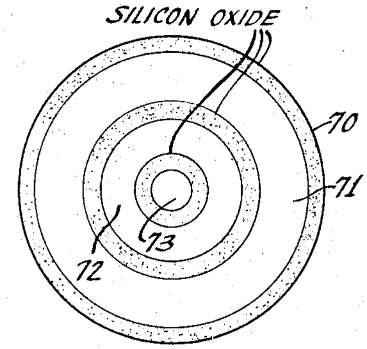
FIGURES 11–14 are plan views of semiconductor devices according to other embodiments; and, FIGURE 15 is a plot of the electrical characteristics of the device in FIGURE 10, showing the characteristic variation in source-drain current with source-drain voltage for different values of source-gate bias.

For example, the electrode configuration of one semiconductor device is circular and concentric. The device comprises a silicon body 70 (FIGURE 11) in the shape of a disc. On one face of silicon disc 70, a central circular drain electrode 73 is in contact with a central donor-diffused drain region (not shown). An annular gate or control electrode 72 surrounds the drain electrode, and an annular source electrode 71 surrounds the gate electrode and is in contact with a corresponding donor-diffused annular source region (not shown) in the wafer.

Figure 12:
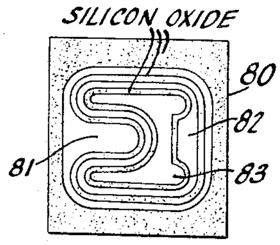

Alternatively, the completed unit may comprise a silicon body 80 (FIGURE 12) having on one face thereof a central drain electrode 83, a gate or control electrode 82 surrounding the drain electrode 83, and a source electrode 81 surrounding the gate electrode 82. The electrodes in this example may be described as free form, since they do not have regular geometric shapes. The source and drain regions (not shown) of the device correspond in general shape to the shape of the source and drain electrodes 81 and 83 respectively.

Figure 13:
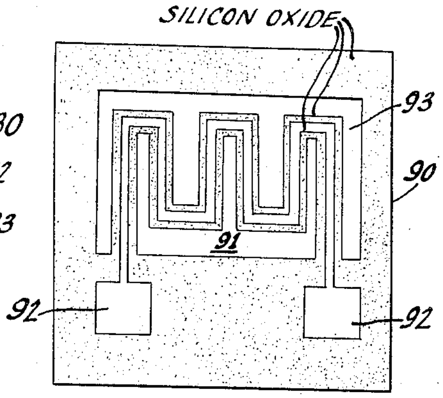

Another arrangement, for example, is a device comprising a silicon body 90 (FIGURE 13) having on one face thereof comb-like or interdigitated source and drain electrodes 93 and 91 respectively, with a gate or control electrode 92 between them. The source and drain regions (not shown) of the device correspond in general shape to the shape of the source and drain electrodes 93 and 91 respectively.

Figure 14:
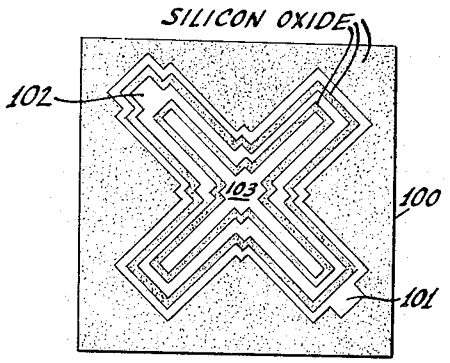

Alternatively, a device may be made comprising a silicon body 100 (FIGURE 14) having an X-shaped central drain electrode 103, an X-shaped gate electrode 102 surrounding the drain electrode 103, and an X-shaped source electrode 101 surrounding the gate electrode. The source and drain regions (not shown) of the device correspond in general shape to the shape of the source and drain electrodes 101 and 103 respectively.

It will be noted that in each of the above configurations of FIGURES 11 to 14, the gate electrode surrounds the drain electrode, and the source electrode surrounds the gate electrode. This arrangement has been found particularly advantageous.

An advantage of the various methods of fabricating semiconductor devices described above is that the conductive channel 30 in each unit formed from a particular silicon slice exhibits uniform resistivity from unit to unit. This uniformity is important, since it enables the production of a large number of devices with uniform and reproducible electrical characteristics. Another advantage is that the conductive channel thus prepared is relatively thin, and relatively free from traps, and current through the channel is easily modulated by the applied field generated by the bias applied to the gate electrode.

Another feature of the invention is that the conductivity of the channel may be monitored and adjusted to the desired values prior to completing the fabrication of the device, thus reducing the amount of scrap. If desired, the conductivity of the channel may be continuously monitored while the silicon body is being heated in a hydrogen-containing ambient, so that the process can be stopped when the desired value is obtained for the conductivity of the channel.

Still another advantage is that the method is simple, rapid, and inexpensive as compared to prior art methods for fabricating such conductive channels.

It will be understood that the embodiments described above are by way of illustration and explanation only, but not limitation. Other conductive metals such as gold, palladium, chromium, and the like, may be utilized for the electrodes instead of aluminum. The conductive metal may be deposited by electroplating, or by electroless plating, instead of by evaporation. Various other modifications may be made without departing from the spirit and scope of the invention as described in the specification and appended claims.

What is claimed is:

1. The method of forming a conductive channel of desired conductivity in a crystalline silicon body comprising the steps of forming a coating of silicon oxide on said silicon body by heating it in a dry oxygen ambient for a time and at a temperature insufficient to raise the conductivity of said body near the interface between said body and said coating, said conductivity being initially, and thus being held, at a value less than said desired conductivity; and thereafter heating said body in a free-hydrogen-containing reducing ambient for a time and at a temperature sufficient to form in said body a thin conductive channel of said desired conductivity underneath said silicon oxide coating.

2. The method as defined in claim 1 wherein said second heating step is carried out by heating said body in said hydrogen containing ambient for a predetermined time;

measuring the electrical conductivity of said conductive channel;

when the measured conductivity of said channel is less than the desired value, reheating said body in a hydrogen-containing ambient; and when said measured conductivity has reached said desired value, cooling said body to room temperature.

3. The method of claim 1 including the further steps of continuously measuring the electrical conductivity of said conductive channel while said body is being heated in said hydrogen-containing ambient; and terminating the heating when the measured conductivity reaches the desired value.

4. The method of fabricating a semiconductor device, comprising the steps of:

preparing a body of crystalline silicon having a conductivity type selected from the group consisting of P-type, intrinsic, and lightly doped N-type;

diffusing a donor selected from the group consisting of arsenic, antimony and phosphorous into two spaced portions of one face of the body to form two donor-diffused regions therein;

heating said body in an ambient of dry oxygen for a time and at a temperature sufficient to form a silicon oxide coating on said face of said body;

making two openings in said silicon oxide coating to expose two portions of said one face of said body, one said exposed portion being entirely within the surface boundary of one said donor-diffused region, and the other said exposed portion being entirely within the surface boundary of the other said donor-diffused region;

heating said body at a temperature of about 200° to 1000° C. in an ambient selected from the group consisting of hydrogen and mixtures of hydrogen and non-oxidizing gases to form in said body a thin conductive channel underneath said silicon oxide coating;

depositing metallic contacts respectively on said exposed portions of said one face, and on a poriton of said silicon oxide coating between said exposed portions; and, attaching an electrical lead wire to each of said contacts.

5. The method of fabricating a semiconductor device, comprising the steps of:

preparing a body of crystalline silicon having a conductivity type selected from the group consisting of P-type, intrinsic, and lightly doped N-type;

diffusing a donor selected from the group consisting of arsenic, antimony and phosphorous into two spaced portions of one face of said body to form two donor-diffused regions therein;

heating said body in an ambient of dry oxygen for about 3 to 4 hours at about 1000° C. to form a silicon oxide coating on said one face of said body;

making two openings in said silicon oxide coating to expose two portions of said one face of said body, one said exposed portion being entirely within the surface boundary of one said donor-diffused region, and the other said exposed portion being entirely within the surface boundary of the other said donor-diffused region;

heating said body at a temperature of about 200° to 1000° C. in ambient of forming gas to form in said body a thin conductive channel underneath said silicon oxide coating;

depositing metallic contacts respectively on said exposed portions of said one face, and on a portion of said silicon oxide coating between said exposed portions; and, attaching an electrical lead wire to each of said contacts.

6. The method of fabricating a semiconductor device, comprising the steps of:

preparing a body of crystalline silicon having a conductivity type selected from the group consisting of P-type, intrinsic, and lightly doped N-type;

diffusing a donor selected from the group consisting of arsenic, antimony and phosphorus into two spaced portions of one face of said body;

heating said body in an ambient of dry oxygen so as to form a silicon oxide coating on the surface of said body;

making two openings in said silicon oxide coating to expose two portions of said one face of said body, one said exposed portion being entirely within the surface boundary of one said donor-diffused region, and the other said exposed portion being entirely within the surface boundary of the other said donor-diffused region;

heating said body in a hydrogen-containing ambient at a temperature of about 200° to 1000° C. to form said body a thin conductive channel underneath said silicon oxide coating;

measuring the electrical conductivity of said conductive channel;

when said measured electrical conductivity of said conductive channel is less than the value desired, reheating said body in a hydrogen-containing ambient;

when said measured conductivity has reached a desired value, cooling said body to room temperature;

depositing metallic contacts respectively on said exposed portions of said one face and on a portion of said silicon oxide coating between said exposed portions; and, attaching an electrical lead wire to each of said contacts.

7. The method of fabricating a semiconductor device, comprising the steps of:

preparing a body of crystalline silicon having a conductivity type selected from the group consisting of P-type, intrinsic, and lightly doped N-type;

diffusing a donor selected from the group consisting of arsenic, antimony and phosphorous into two spaced portions of one face of said body to form two donor-diffused regions therein;

heating said body in an ambient of dry oxygen to form a silicon oxide coating on the surface of said body;

making two openings in said silicon oxide coating to expose two portions of said one face of said body, one said exposed portion being entirely within the surface boundary of one said donor-diffused region, and the other said exposed portion being entirely within the surface boundary of the other said donor-diffused region;

heating said body at a temperature of about 200° to 1000° C. in a hydrogen-containing ambient to form in said body a thin conductive channel underneath said silicon oxide coating;

continuously measuring the electrical conductivity of said conductive channel while said body is being heated in said hydrogen-containing ambient;

when said measured electrical conductivity reaches a desired value, ending said heating in said hydrogen-containing ambient and cooling said body to room temperature;

depositing metallic contacts respectively on said exposed portions of said one face and on a portion of said silicon oxide coating between said exposed portions; and, attaching an electrical lead wire to each of said contacts.

References Cited

UNITED STATES PATENTS

| | | | |
|---|---|---|---|
| 2,981,646 | 4/1961 | Robinson | 148—1.5 |
| 3,226,611 | 12/1965 | Haenichen | 317—234 |
| 3,226,614 | 12/1965 | Haenichen | 317—234 |
| 3,261,074 | 7/1966 | Beauzee | 29—25.3 |

WILLIAM I. BROOKS, *Primary Examiner.*